US011349045B2

(12) United States Patent
Horng et al.

(10) Patent No.: US 11,349,045 B2
(45) Date of Patent: May 31, 2022

(54) LIGHT EMISSION DIODE WITH FLIP-CHIP STRUCTURE AND MANUFACTURING METHOD THEREOF

(71) Applicant: NATIONAL CHIAO TUNG UNIVERSITY, Hsinchu (TW)

(72) Inventors: Ray-Hua Horng, Taichung (TW); Ken-Yen Chen, Taichung (TW); Huan-Yu Chien, Yilan County (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 16/935,625

(22) Filed: Jul. 22, 2020

(65) Prior Publication Data

US 2020/0350463 A1 Nov. 5, 2020

Related U.S. Application Data

(62) Division of application No. 15/879,438, filed on Jan. 25, 2018, now Pat. No. 10,770,617.

(30) Foreign Application Priority Data

Aug. 9, 2017 (TW) .................................. 106126932

(51) Int. Cl.
*H01L 33/00* (2010.01)
*H01L 33/62* (2010.01)
(Continued)

(52) U.S. Cl.
CPC .......... *H01L 33/0093* (2020.05); *H01L 33/42* (2013.01); *H01L 33/44* (2013.01);
(Continued)

(58) Field of Classification Search
CPC ......... H01L 33/42; H01L 33/62; H01L 33/44; H01L 33/06; H01L 33/30; H01L 33/32; H01L 33/0093; H01L 2933/0066
See application file for complete search history.

(56) References Cited

U.S. PATENT DOCUMENTS

| 2006/0006402 A1* | 1/2006 | Hsieh | ...................... | H01L 33/46 |
| | | | | 257/E33.068 |
| 2012/0199861 A1* | 8/2012 | Tsuji | ...................... | H01L 33/42 |
| | | | | 257/98 |

(Continued)

*Primary Examiner* — Latanya N Crawford Eason
(74) *Attorney, Agent, or Firm* — Rabin & Berdo, P.C.

(57) ABSTRACT

A light emitting diode device with flip-chip structure includes a transparent protective substrate, a transparent conductor layer, a glue layer, a group III-V stack layer, a first conductivity metal electrode, a second conductivity metal electrode and an insulating layer. The transparent conductor layer is formed on the transparent protective substrate. The glue layer bonds the transparent protective substrate and the transparent conductor layer. The group III-V stack layer and the first conductivity metal electrode are respectively formed on a first portion and a second portion of the transparent conductor layer. The second conductivity metal electrode is formed on a portion of the group III-V stack layer. The insulating layer covers exposed portions of the transparent conductor layer and the group III-V stack layer, and the insulating layer further covers portions of the first and second conductivity metal electrodes, so as to expose the first and second conductivity metal electrodes.

6 Claims, 6 Drawing Sheets

(51) Int. Cl.
  *H01L 33/42*      (2010.01)
  *H01L 33/44*      (2010.01)
  *H01L 33/32*      (2010.01)
  *H01L 33/30*      (2010.01)
  *H01L 33/06*      (2010.01)

(52) U.S. Cl.
  CPC .............. *H01L 33/62* (2013.01); *H01L 33/06* (2013.01); *H01L 33/30* (2013.01); *H01L 33/32* (2013.01); *H01L 2933/0066* (2013.01)

(56) References Cited

U.S. PATENT DOCUMENTS

| | | | |
|---|---|---|---|
| 2012/0241760 A1* | 9/2012 | Okabe | H01L 33/38 257/E33.025 |
| 2015/0144984 A1* | 5/2015 | Chen | H01L 33/08 257/99 |
| 2019/0067525 A1* | 2/2019 | Xu | H01L 33/0093 |

\* cited by examiner

| 301 |
|---|

| 302 |
|---|
| 303 |
| 304 |
| 305 |
| 306 |
| 307 |
| 308 |
| 320 |

FIG. 3A

| 301 |
|---|
| 302 |
| 303 |
| 304 |
| 305 |
| 306 |
| 307 |
| 308 |
| 320 |

LIGHT EMISSION DIODE WITH FLIP-CHIP STRUCTURE AND MANUFACTURING METHOD THEREOF

CROSS-REFERENCE TO RELATED APPLICATION

This application is a divisional of U.S. application Ser. No. 15/879,438, filed on Jan. 25, 2018, and claims priority from Taiwan Application No. 106126932, filed on Aug. 9, 2017, in the Taiwan Intellectual Property Office, the content of which is hereby incorporated by reference in their entirety for all purposes.

BACKGROUND OF THE INVENTION

1. Field of the Invention

The present disclosure relates to a structure of a lighting device, and in particular, to an LED device with flip-chip structure and manufacturing method thereof.

2. Description of the Related Art

Firstly, refer to FIG. 1. FIG. 1 is a schematic diagram showing a sectional structure of a conventional LED device with flip-chip structure. The conventional flip-chip LED device 1 comprises a transparent protective substrate 101 (such as, a sapphire substrate), a glue layer 102 (such as, optical glue layer), a transparent conductor layer 103 (such as, an indium tin oxide layer), group III-V layer 104 (such as, a gallium phosphide layer or a gallium nitride layer), a first conductivity semiconductor layer 105 (such as, a P-type semiconductor layer), a quantum well and separation confining layer 106, a second conductivity semiconductor layer 107 (such as, a N-type semiconductor layer), a group III-V contacting layer 108 (such as, a gallium arsenide contacting layer or a gallium nitride contacting layer), a second conductivity metal electrode 109 (such as, a N-type metal electrode), a first conductivity metal electrode 110 (such as, a P-type metal electrode), an insulating layer 111 (such as, a silicon dioxide layer), a first smooth electrode layer 113 and a second smooth electrode layer 112 (such as, titanium or gold layer).

The first conductivity semiconductor layer 105, the quantum well and separation confining layer 106, the second conductivity semiconductor layer 107, the group III-V contacting layer 108 and the second conductivity metal electrode 109 are sequentially formed one portion of an upper surface of the group III-V layer 104, and the first conductivity metal electrode 110 is formed on other one portion of the upper surface of the group III-V layer 104, such that the first conductivity metal electrode 110 and each of the first conductivity semiconductor layer 105, the quantum well and separation confining layer 106, the second conductivity semiconductor layer 107, the group III-V contacting layer 108 and the second conductivity metal electrode 109 has gap therebetween, and other portions of the upper surface of the group III-V layer 104 is exposed, wherein second conductivity metal electrode 109 is formed on merely one portion of an upper surface of the group III-V contacting layer 108, and other portions of the upper surface of the group III-V contacting layer 108 is exposed.

The transparent conductor layer 103 is formed under a lower surface of the group III-V layer 104, and the glue layer 102 contacts the lower surface group III-V layer 104 and an upper surface of the transparent protective substrate 101, so as to glue the transparent protective substrate 101 with the transparent conductor layer 103. The insulating layer 111 is formed on an exposed portion of the upper surface of the group III-V layer 104 and an exposed portion of the upper surface of the group III-V contacting layer 108, the insulating layer 111 is further formed on a portion of an upper surface of the second conductivity metal electrode 109 and a portion of an upper surface of the first conductivity metal electrode 110, and openings are formed on the upper surfaces of the second conductivity metal electrode 109 and the first conductivity metal electrode 110. The second smooth electrode layer 112 and the first smooth electrode layer 113 are respectively formed on the openings on the upper surfaces of the second conductivity metal electrode 109 and the first conductivity metal electrode 110, and further cover a portion of an upper surface of the insulating layer 111.

During the manufacturing procedure of the conventional flip-chip LED device 1, one etching process is performed to etch the first conductivity semiconductor layer 105, the quantum well and separation confining layer 106, the second conductivity semiconductor layer 107 and the group III-V contacting layer 108, so as to expose the residual portions of the first conductivity semiconductor layer 105, the quantum well and separation confining layer 106, the second conductivity semiconductor layer 107 and the group III-V contacting layer 108, wherein the above residual portions form the second conductivity plat illumination region. In short, the etching process merely etches to group III-V layer 104.

The group III-V layer 104 functions as a cladding layer, and the cladding layer is coated with the first conductivity metal electrode 110. During the manufacturing procedure of the conventional flip-chip LED device 1, the first conductivity metal electrode 110 should be coated with the contacting metal and the thermal annealing process should be performed to form an Ohmic contact, and then the first conductivity metal electrode 110 is padded by and coated with the contacting metal. Since the first conductivity metal electrode 110 is formed on the cladding layer, the manufacturing procedure needs high temperature annealing, and it causes process uncertainty. In this case, the fabrication yield could be reduced.

In other one side, during the manufacturing procedure of the conventional flip-chip LED device 1, a gluing process and a flipping process are required, but the high temperature annealing causes the damage for the glue of the glue layer 102. Thus, merely the process of the non-substrate thin film flip-chip LED can be implemented, and it causes that the conventional flip-chip LED device 1 may be damaged easily during the manufacturing procedure.

SUMMARY OF THE INVENTION

Exemplary embodiments of the present disclosure provide a flip-chip LED device and manufacturing method thereof without high temperature annealing. A transparent conductor layer of the above flip-chip LED device is directly coated with a first conductivity metal electrode and the transparent conductor layer functions as a cladding layer which directly connects the first conductivity metal electrode. The flip-chip LED device does not need the usage of the Ohmic contacting electrode, and the high temperature annealing process is not necessary, either, such that the manufacturing cost is decreased and the process yield is increased.

An exemplary embodiment of the present disclosure provides a flip-chip LED device a transparent protective substrate, a transparent conductor layer, a glue layer, a group III-V stack layer, a first conductivity metal electrode, a second conductivity metal electrode and an insulating layer. The transparent conductor layer is formed on the transparent protective substrate. The glue layer glues the transparent protective substrate and the transparent conductor layer. The group III-V stack layer and the first conductivity metal electrode are respectively formed on a first portion and a second portion of the transparent conductor layer. The second conductivity metal electrode is formed on a portion of the group III-V stack layer. The insulating layer covers exposed portions of the transparent conductor layer and the group III-V stack layer, and the insulating layer further covers portions of the first and second conductivity metal electrodes, so as to expose the first and second conductivity metal electrodes.

An exemplary embodiment of the present disclosure provides a manufacturing method of a flip-chip LED device comprises steps as follows. A group III-V substrate is provided, and a group III-V stack layer is formed on the group III-V substrate. A transparent conductor layer is formed on the group III-V stack layer. A glue layer is coated on the transparent conductor layer, and the transparent conductor layer is bonded with a transparent protective substrate. A separation process is performed, so as to remove the group III-V substrate from the group III-V stack layer. A stacking structure formed by the group III-V stack layer, the transparent conductor layer and the transparent protective substrate is flipped once. A second conductivity region is defined and a metal deposition is performed to define a second conductivity metal electrode on the second conductivity region, and then a reactive ion etching process is performed to etch the group III-V stack layer through the transparent conductor layer within a non-protective region. A first conductivity metal electrode region and a first conductivity metal electrode on the first conductivity metal electrode region are defined, and the first conductivity metal electrode region is coated with a first metal to form and pad the first conductivity metal electrode on the first conductivity metal electrode region. A second conductivity metal electrode region on the second conductivity region is defined, and the second conductivity metal electrode region is coated with a second metal. A physical deposition is used to coat the first conductivity metal electrode, the second conductivity metal electrode and the transparent conductor layer with an insulating layer, such that the insulating layer covers the first conductivity metal electrode, the second conductivity metal electrode and the transparent conductor layer. The first conductivity metal electrode and the second conductivity metal electrode are defined and an etching process is performed to expose the first conductivity metal electrode and the second conductivity metal electrode.

To sum up, in the flip-chip LED device and the manufacturing method thereof provided by exemplary embodiments of the present disclosure, the transparent conductor layer is directly coated with the first conductivity metal electrode, and the transparent conductor layer functions as the cladding layer which connects the first conductivity metal electrode. Thus, compared to the prior art, the present disclosure can have advantages as follows.

(1) The Ohmic contacting electrode is not required.
(2) The high temperature annealing is not required.
(3) The manufacturing cost is decreased.
(4) The process yielding rate is increased.

BRIEF DESCRIPTION OF THE DRAWINGS

FIG. 3A through FIG. 3G are schematic diagrams depicting a manufacturing procedure of a flip-chip LED device according to an exemplary embodiment of the present disclosure.

DESCRIPTION OF THE EXEMPLARY EMBODIMENTS

Figure 1:
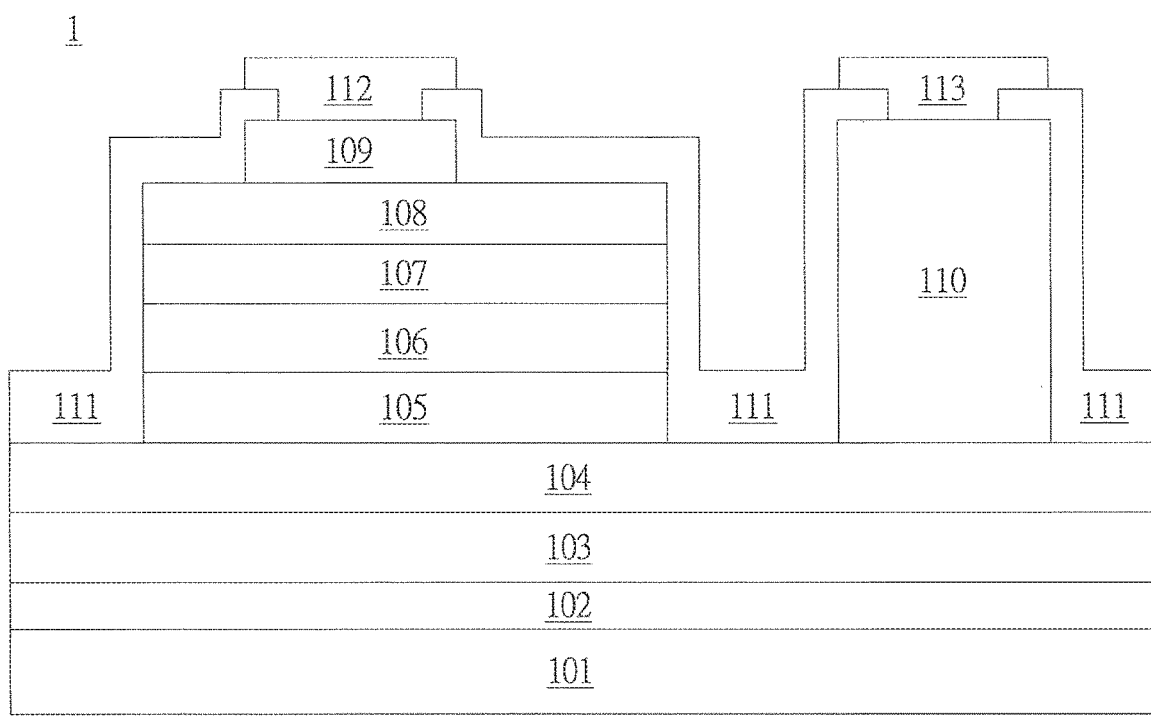
FIG. 1 is a schematic diagram showing a sectional structure of a conventional flip-chip LED device.

The present disclosure will be described in more detail below with reference to the accompanying drawings, in which exemplary embodiments of the present disclosure are shown. It will be understood by those skilled in the art that the described embodiments may be modified in various ways without departing from the spirit or scope of the present disclosure.

In order to clearly describe the present disclosure, portions not related to the present description are omitted, and like reference numerals refer to like elements throughout the specification. In addition, the dimensions and thicknesses of the individual structural members shown in the drawings are illustrative for convenience of illustration, and the present disclosure is not limited to the illustrated drawings.

Figure 2:
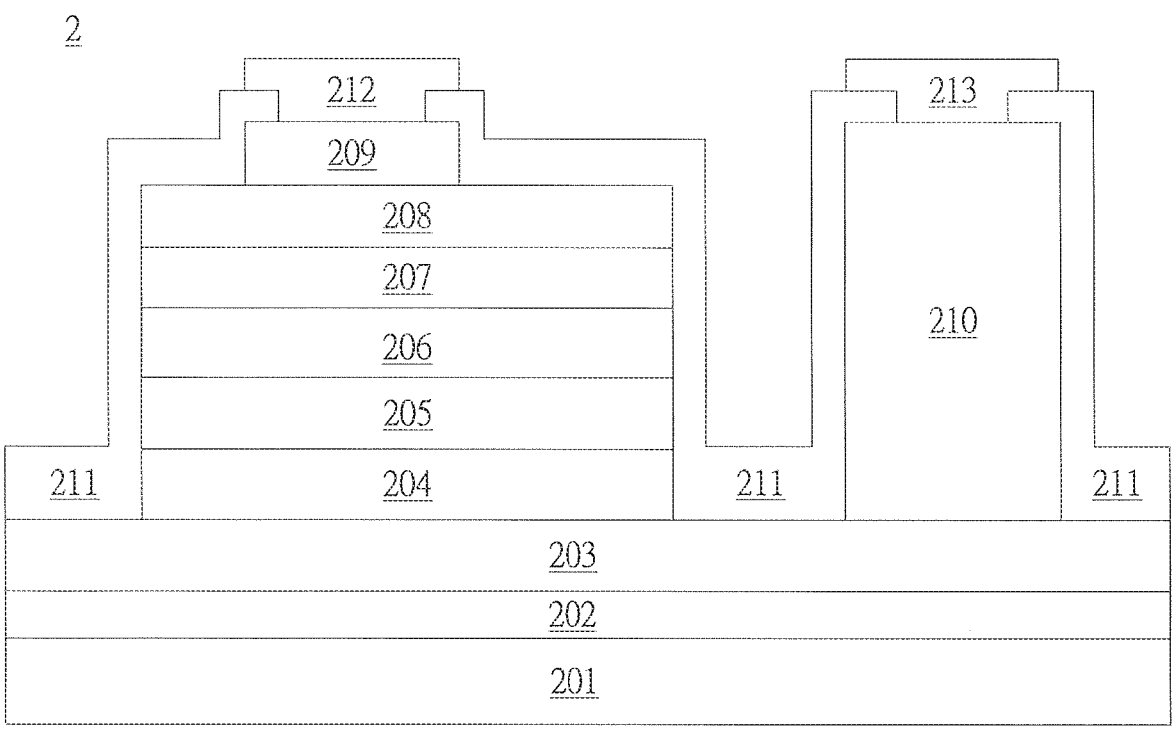
FIG. 2 is a schematic diagram showing a sectional structure of a flip-chip LED device according to an exemplary embodiment of the present disclosure.

Firstly, refer to FIG. 2. FIG. 2 is a schematic diagram showing a sectional structure of a flip-chip LED device according to an exemplary embodiment of the present disclosure. The flip-chip LED device 2 can be micro OLED device for example, and the color of the illumination light is red. However, the type and illumination light color of the flip-chip LED device 2 are not used to limit the present disclosure.

The flip-chip LED device 2 comprises a transparent protective substrate 201, a glue layer 202, a transparent conductor layer 203, a group III-V stack layer (204 through 208), a first conductivity metal electrode 210, a second conductivity metal electrode 209, an insulating layer 211, a second smooth electrode layer 212 and a first smooth electrode layer 213.

The glue layer 202 is used glue the transparent protective substrate 201 with the transparent conductor layer 203, such that the transparent conductor layer 203 is formed on the transparent protective substrate 201. In the exemplary embodiment of the present disclosure, the glue layer 202 can be a transparent optical glue layer, the transparent protective substrate 201 can be sapphire substrate or a glass substrate, the transparent conductor layer 203 can be a conductive metal oxide layer, such as an indium tin oxide layer, and the present disclosure does not limit the types of the transparent protective substrate 201, the glue layer 202 and the transparent conductor layer 203.

The group III-V stack layer (204 through 208) is formed on a first portion of the transparent conductor layer 203, and the first conductivity metal electrode 210 is formed on a second portion of the transparent conductor layer 203, and the second conductivity metal electrode 209 is formed on a portion of the group III-V stack layer (204 through 208), such that the first conductivity metal electrode 210 and the group III-V stack layer (204 through 208) has a gap therebetween.

In the exemplary embodiment of the present disclosure, the first conductivity metal electrode 210 and the second conductivity metal electrode 209 are respectively a P-type metal electrode and a N-type metal electrode, wherein the first conductivity metal electrode 210 is selected from a metal which is coated with "titanium and aluminum" or "chromium and gold", and the second conductivity metal electrode 209 is selected from at least one of gold and gold germanium alloy. However, the present disclosure does not limit the type and material of the first conductivity metal electrode 210 and the second conductivity metal electrode 209.

The insulating layer 211 covers an exposed portion of the transparent conductor layer 203 (i.e. the portion outside the first and second portions of the transparent conductor layer 203), an exposed portion of the group III-V stack layer (204 through 208) (i.e. the other portion of the group III-V stack layer not covered by the second conductivity metal electrode 209), and the insulating layer 211 further covers a portion of the first conductivity metal electrode 210 and a portion of the second conductivity metal electrode 209, so as to expose the first conductivity metal electrode 210 and the second conductivity metal electrode 209. In the exemplary embodiment of the present disclosure, the insulating layer 211 can be a silicon dioxide layer, and the present disclosure does not limit the material of the insulating layer 211.

The first smooth electrode layer 213 and the second smooth electrode layer 212 respectively covers an exposed portion of the first conductivity metal electrode 210 (i.e. the other portion of the first conductivity metal electrode 210 not covered by the insulating layer211) and an exposed portion of the second conductivity metal electrode 209 (i.e. the other portion of the second conductivity metal electrode 209 not covered by the insulating layer 211), and further cover a portion of the insulating layer 211. In the exemplary embodiment of the present disclosure, the first smooth electrode layer 213 and the second smooth electrode layer 212 can be selected from at least one of titanium and gold, and the material of the first smooth electrode layer 213 and the second smooth electrode layer 212 is not used to limit the present disclosure.

The group III-V stack layer (204 through 208) comprises a group III-V layer 204, a first conductivity semiconductor layer 205, a quantum well and separation confining layer 206, a second conductivity semiconductor layer 207 and a group III-V contacting layer 208. The group III-V layer 204 is formed on the first portion of the transparent conductor layer 203. The first conductivity semiconductor layer 205 is formed on the group III-V layer 204. The quantum well and separation confining layer 206 is formed on the first conductivity semiconductor layer 205. The second conductivity semiconductor layer 207 is formed on the quantum well and separation confining layer 206. The group III-V contacting layer 208 is formed on the second conductivity semiconductor layer 207.

In the exemplary embodiment of the present disclosure, the group III-V layer 204 is a gallium phosphide (GaP) layer, a gallium nitride (GaN) layer or a gallium nitride aluminum indium layer. The first conductivity semiconductor layer 205 is a P-type semiconductor layer, the second conductivity semiconductor layer 207 a N-type semiconductor layer, and the group III-V contacting layer 208 functions as a group III-V semiconductor contacting layer for forming an Ohm contact, for example, a gallium arsenide (GaAs) contacting layer or a gallium nitride (GaN) contacting layer. However, the preset disclosure does not limit the types and materials of the group III-V layer 204, the first conductivity semiconductor layer 205, the second conductivity semiconductor layer 207 and the group III-V contacting layer 208.

From the exemplary embodiment of FIG. 2, it can be known that the transparent conductor layer 203 of the flip-chip LED device 2 functions as a cladding layer, such that the transparent conductor layer 203 is directly coated with the first conductivity metal electrode 210. The flip-chip LED device 2 does not need the Ohm contacting electrode, and also does not needs the high temperature annealing, such that the manufacturing cost is decreased and the process yielding rate is increased.

Next, the manufacturing method of the flip-chip LED device in the present disclosure is illustrated. Refer FIG. 3A through FIG. 3G. FIG. 3A through FIG. 3G are schematic diagrams depicting a manufacturing procedure of a flip-chip LED device according to an exemplary embodiment of the present disclosure.

Firstly, in FIG. 3A, the group III-V substrate 320 is provided, and a group III-V stack layer (302 through 308) is formed on the group III-V substrate 320. Specifically, the manner for forming the group III-V stack layer (302 through 308) on the group III-V substrate 320 is to sequentially form the group III-V contacting layer 308, the second conductivity semiconductor layer 307, the quantum well and separation confining layer 306, the second conductivity semiconductor layer 305 and the group III-V layer 304 on the group III-V substrate 320. Next, the transparent conductor layer 303 is formed on the group III-V stack layer (304 through 308), for example the electron gun is used to coat the group III-V layer 304 with the transparent conductor layer 303. Moreover, the transparent conductor layer 303 is directly formed on the group III-V layer 304. Next, a glue layer 302 is smeared on the transparent conductor layer 303, and the transparent conductor layer 303 is glued with the transparent protective substrate 301.

In the exemplary embodiment of the present disclosure, the group III-V substrate 320 can be the gallium arsenide (GaAs) substrate, the transparent protective substrate 301 can be the sapphire substrate, the glue layer 302 can be the transparent optical glue layer, the transparent conductor layer 303 can be indium tin oxide layer, the group III-V layer 304 can be the gallium phosphide (GaP) layer, the first conductivity semiconductor layer 305 can be the P-type semiconductor layer, the second conductivity semiconductor layer 307 can be the N-type semiconductor layer, and the group III-V contacting layer 308 can be the gallium arsenide (GaAs) contacting layer. However, the present disclosure does not limit the types and materials of the group III-V substrate 320, the transparent protective substrate 301, the glue layer 302, the group III-V layer 304, the first conductivity semiconductor layer 305, the second conductivity semiconductor layer 307 and the group III-V contacting layer 308.

Next, in FIG. 3B, the separation process is performed by a wet etching process to remove group III-V stack layer (304 through 308) from the group III-V substrate 320. For example, the prepared gallium arsenide etchant can etch to the gallium arsenide (GaAs) contacting layer, such that the gallium arsenide (GaAs) substrate can be removed. Next, the stack structure formed by the group III-V stack layer (304 through 308), the transparent conductor layer 303 and the transparent protective substrate 301 is flipped once.

Figures 3C, 3D:
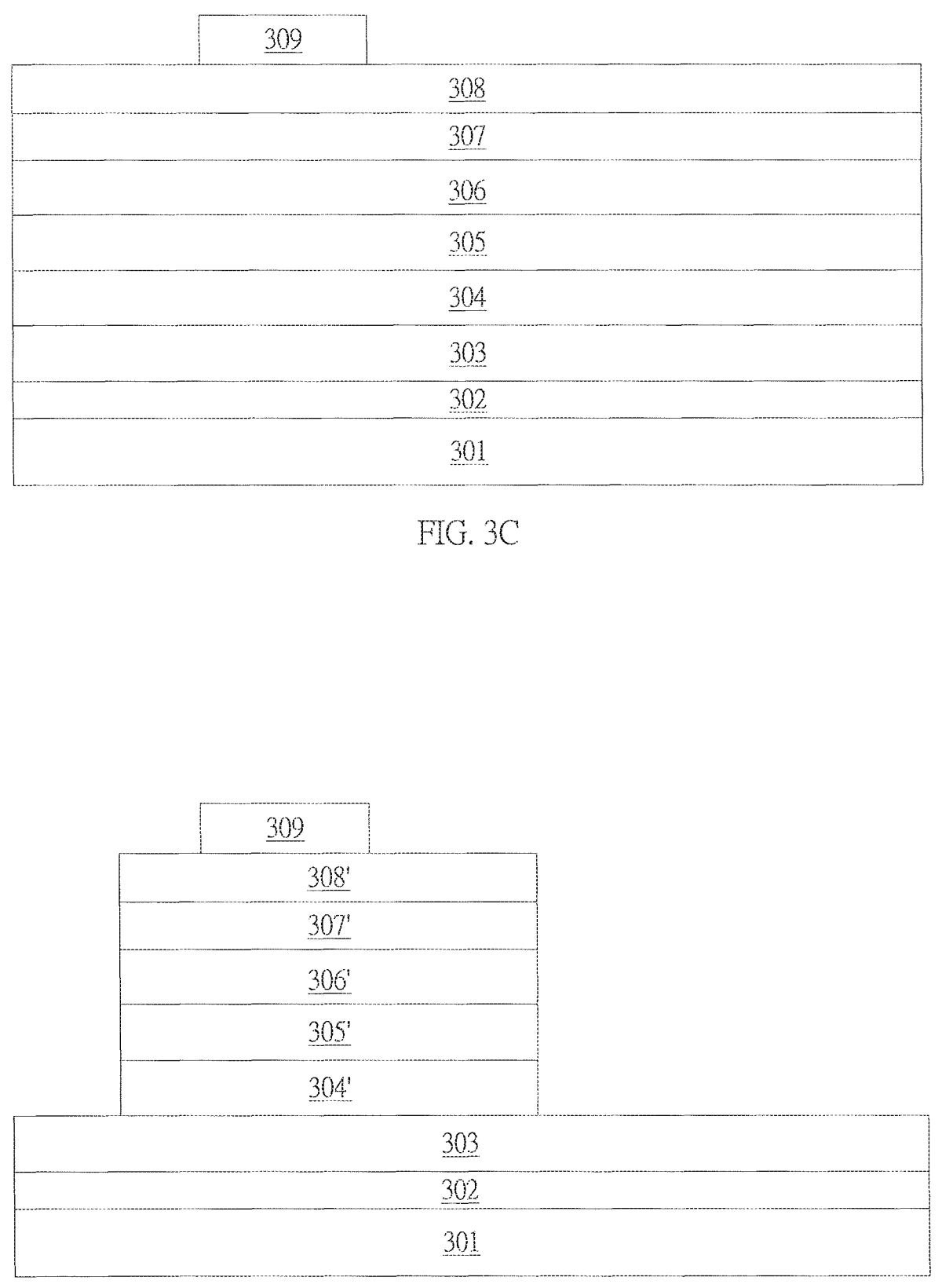

Next, referring to FIG. 3C, the photo resistor is used to define the second conductivity plat illumination region (the region of elements 304' through 308' in FIG. 3D), and the metal deposition is performed to define the second conductivity metal electrode 309 on the second conductivity plat illumination region. Next, referring to FIG. 3D, after the second conductivity plat illumination region is defined, the reactive ion etching process (for example, Inductively Coupled Plasma Reactive Ion Etching (ICP RIE) process) is performed, so as to etch the group III-V stack layer (304 through 308) to the transparent conductor layer 301 within the non-protective region (the region outside the elements 304' through 308', and that is, the region outside the second conductivity plat illumination region). Next, the above used photo resistor is removed.

Figure 3E:
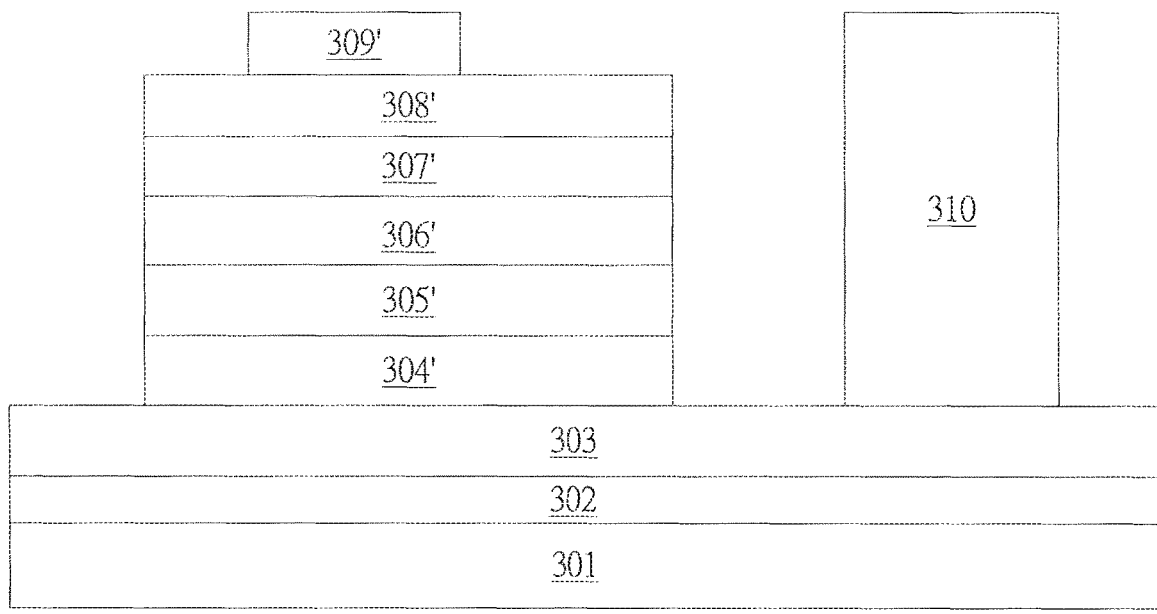

Next, referring to FIG. 3E, the negative photo resistor is used to define the first conductivity metal electrode region (i.e. the region of the element 310) and the first conductivity metal electrode 310 on the first conductivity metal electrode region, and the electron gun is used to coat the first conductivity metal electrode region with the first metal to form and pad the first conductivity metal electrode 310 of the first conductivity metal electrode region. Then, the negative photo resistor is used to define the second conductivity metal electrode region on the second conductivity plat illumination region. Next, the thermal evaporator is used to coat the second conductivity metal electrode region with the second metal, so as to from the second conductivity metal electrode 309'. Then, the negative photo resistor is removed.

In the exemplary embodiment of the present disclosure, the first conductivity metal electrode 310 and the second conductivity metal electrode 309' are respectively the P-type electrode and the N-type electrode, the second conductivity plat illumination region is the N-type plat illumination region, and the first conductivity metal electrode region and the second conductivity metal electrode region are respectively the P-type electrode region and the N-type electrode region. In addition, the first metal is the high conductance metal coated with the intermediate metal, wherein the intermediate metal can be titanium or chromium, and the high conductance metal can be aluminum or gold (i.e. the surface of the first metal can be coated with "titanium or chromium" and "aluminum or gold" sequentially). The second metal can be selected from at least one of gold and gold germanium alloy. However, the above limitations are used to implement an exemplary embodiment, and they are not limited in the present disclosure.

Figure 3F:
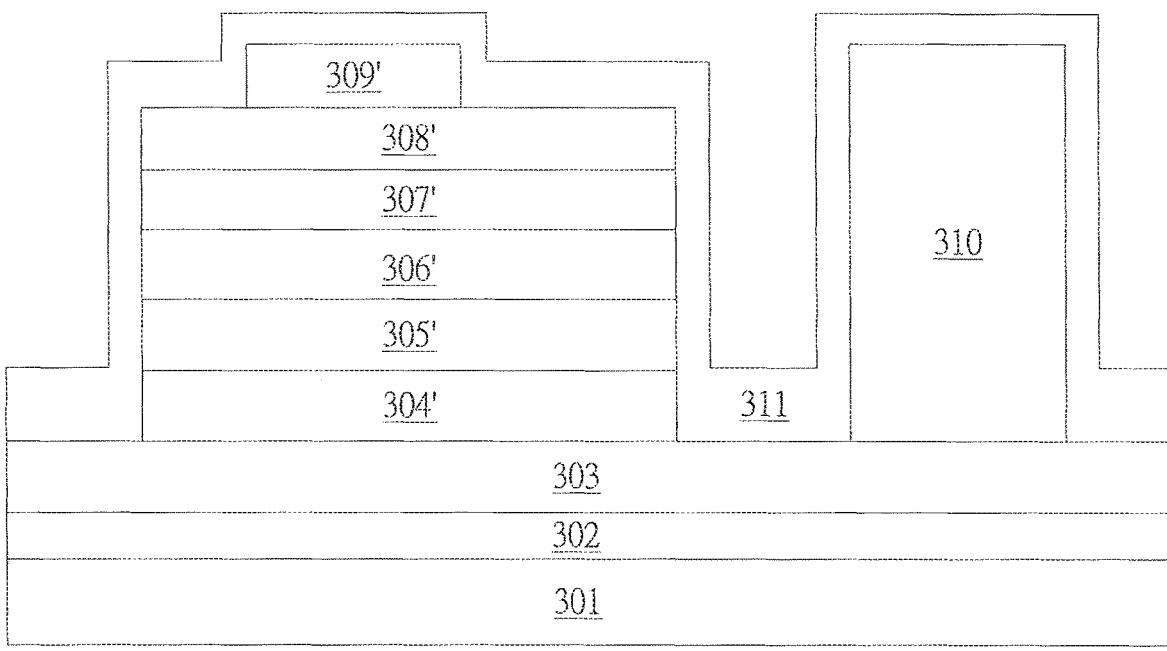

Next, referring to FIG. 3F, the chemical vapor deposition (such as, PECVD) is used to coat first conductivity metal electrode 310, the second conductivity metal electrode 309' and the transparent conductor layer 303 with an insulating layer 311, so as to finish the insulation process. In the exemplary embodiment of the present disclosure, the insulating layer 311 can be the silicon dioxide, and the present disclosure is not limited thereto.

Figure 3G:
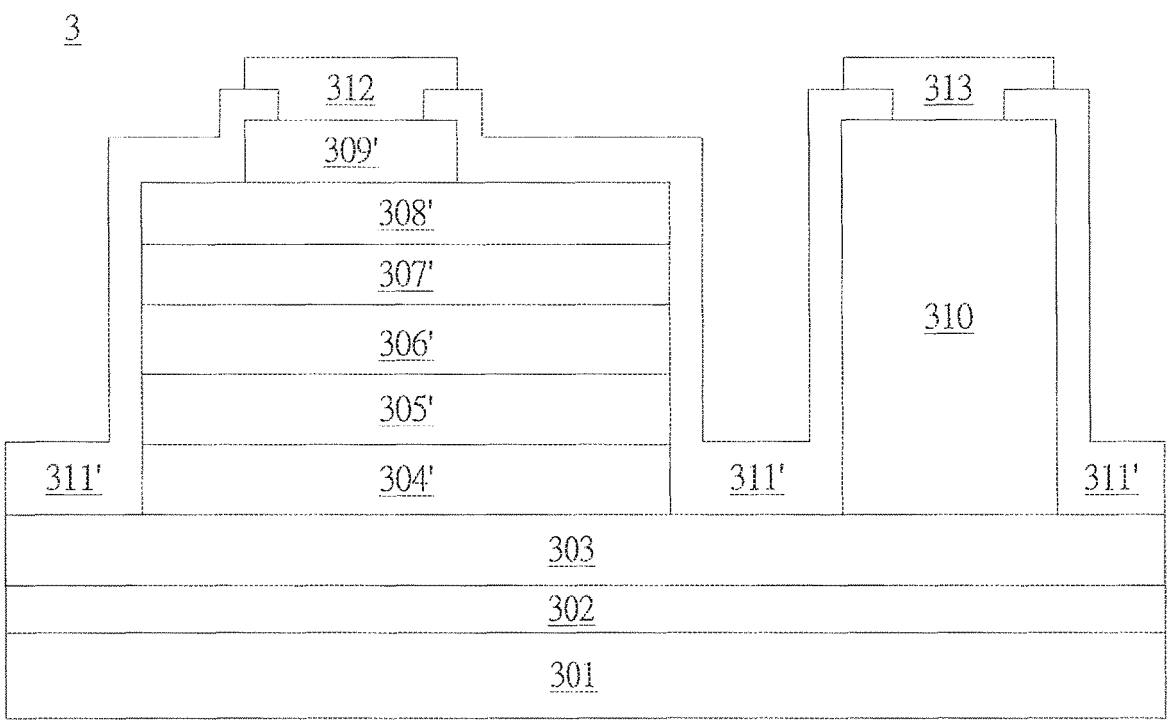

Next, referring to FIG. 3G, the negative photo resistor is used to define the first conductivity metal electrode 310 and the second conductivity metal electrode 309', and the etchant is used to etch the insulating layer 311 to locate the positions of the first conductivity metal electrode 310 and the second conductivity metal electrode 309', i.e. to expose the first conductivity metal electrode 310 and the second conductivity metal electrode 309' (as shown in FIG. 3G, the etched insulating layer 311' has two openings corresponding to the first conductivity metal electrode 310 and the second conductivity metal electrode 309'). Next, the negative photo resistor is removed, and the photo resistor is used to define the first conductivity metal electrode 310 and the second conductivity metal electrode 309'. Then, the electron gun is used to coat the first conductivity metal electrode 310 and the second conductivity metal electrode 309' with the third metal, and thus the first smooth electrode layer 312 and the second smooth electrode layer 313 are formed and the first conductivity metal electrode 310 and the second conductivity metal electrode 309' are smoothed, so as to finish electrode smoothing process. Then, the photo resistor is removed. Next, the transparent protective substrate 301 is grinded and polished, and then the laser is used to perform the cutting process to form a plurality of chip dies of the flip-chip LED device 3. In the exemplary embodiment of the present disclosure, the third metal is selected from at least one of titanium or gold, the transparent protective substrate 301 can be the sapphire substrate which is grinded and polished to have a thickness of 80 μm, and the present disclosure is not limited thereto.

From the exemplary embodiment of FIG. 3A through FIG. 3G, it can be known that during the manufacturing procedure of the flip-chip LED device 3, the transparent conductor layer 303 functions as the cladding layer which is coated with the first conductivity metal electrode 310. Thus, the flip-chip LED device 3 does not need the Ohm contacting electrode and high temperature annealing, resulting low manufacturing cost and high process yielding rate.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A flip-chip light emitting diode (LED) device, comprising:
   a transparent protective substrate;
   a transparent conductor layer, formed on the transparent protective substrate;
   a glue layer, bonding the transparent protective substrate with the transparent conductor layer;
   a group III-V stack layer, formed on a first portion of the transparent conductor layer, wherein the group III-V stack layer comprises:
   a group III-V layer, formed on the first portion of the transparent conductor layer;
   a first conductivity semiconductor layer, formed on the group III-V layer;
   a quantum well and separation confining layer, formed on the first conductivity semiconductor layer;
   a second conductivity semiconductor layer, formed on the quantum well and separation confining layer; and
   a group III-V contacting layer, formed on the second conductivity semiconductor layer;
   a first conductivity metal electrode, formed on a second portion of the transparent conductor layer to directly contact the transparent conductor layer;
   a second conductivity metal electrode, formed on a portion of the group III-V stack layer; and
   an insulating layer, formed on an exposed portion of the transparent conductor layer and an exposed portion of the group III-V stack layer, and the insulating layer further covers a portion of the first conductivity metal electrode and a portion of the second conductivity metal electrode, so as to expose the first conductivity metal electrode and the second conductivity metal electrode.

2. The flip-chip LED device according to claim 1, further comprising:
   a first smooth electrode layer and a second smooth electrode layer, covering an exposed portion and the first conductivity metal electrode and an exposed portion of the second conductivity metal electrode, and further covering a portion of the insulating layer.

3. The flip-chip LED device according to claim 1, wherein the transparent conductor layer is a conductive metal oxide layer, the first conductivity metal electrode is a P-type metal electrode, and the second conductivity metal electrode is a N-type metal electrode.

4. The flip-chip LED device according to claim 3, wherein the first conductivity semiconductor layer is a P-type semiconductor layer, and the second conductivity semiconductor layer is a N-type semiconductor layer, and the group III-V contacting layer functions as a group III-V semiconductor contacting layer for forming an Ohmic contact.

5. The flip-chip LED device according to claim 3, wherein the first conductivity metal electrode is selected from aluminum or gold which is coated with titanium or chromium, the second conductivity metal electrode is selected from at least one of gold and gold germanium alloy, and each of the first smooth electrode layer and the second smooth electrode layer is selected from at least one of titanium and gold.

6. The flip-chip LED device according to claim 3, wherein the insulating layer is a silicon dioxide layer and the transparent protective substrate is a glass substrate or a sapphire substrate.

* * * * *